US006575764B1

(12) United States Patent
Reipur

(10) Patent No.: US 6,575,764 B1
(45) Date of Patent: Jun. 10, 2003

(54) MEANS FOR PROVIDING ELECTRICAL CONTACT

(75) Inventor: John Reipur, Klampenborg (DK)

(73) Assignee: Reipur Technology A/S, Gentofte (DK)

( * ) Notice: Subject to any disclaimer, the term of this patent is extended or adjusted under 35 U.S.C. 154(b) by 0 days.

(21) Appl. No.: 09/701,012

(22) PCT Filed: Apr. 23, 1999

(86) PCT No.: PCT/DK99/00229

§ 371 (c)(1), (2), (4) Date: Nov. 22, 2000

(87) PCT Pub. No.: WO99/62146

PCT Pub. Date: Dec. 2, 1999

(30) Foreign Application Priority Data

May 22, 1998 (DK) ........................................ 1998 00697

(51) Int. Cl.[7] .......................... H01R 12/00; H05K 1/00

(52) U.S. Cl. .......................... 439/66; 439/289; 439/352

(58) Field of Search ................................ 200/511, 245, 200/250, 239, 240, 241, 242, 247, 275; 439/352, 353, 358, 591, 66, 91, 289

(56) References Cited

U.S. PATENT DOCUMENTS

| | | | | |
|---|---|---|---|---|
| 2,127,473 A | | 8/1938 | Sacco | |
| 3,040,284 A | | 6/1962 | Connell | |
| 3,478,298 A | | 11/1969 | Nelson | |
| 3,693,133 A | | 9/1972 | Harbonn et al. | |
| 4,176,898 A | | 12/1979 | Marechal | |
| 4,988,306 A | * | 1/1991 | Hopfer, III et al. | 439/66 |
| 5,127,837 A | * | 7/1992 | Shah et al. | 439/71 |
| 5,409,403 A | | 4/1995 | Falossi et al. | |
| 5,561,594 A | * | 10/1996 | Wakefield | 361/760 |
| 5,704,795 A | * | 1/1998 | Lindeman | 439/66 |
| 5,808,874 A | * | 9/1998 | Smith | 361/769 |
| 6,064,217 A | * | 5/2000 | Smith | 324/760 |

FOREIGN PATENT DOCUMENTS

| | | |
|---|---|---|
| EP | 178953 | 4/1986 |
| EP | 431566 A1 | 6/1991 |

* cited by examiner

*Primary Examiner*—Elvin Enad
*Assistant Examiner*—Kyung S. Lee
(74) *Attorney, Agent, or Firm*—Birch, Stewart, Kolasch & Birch, LLP

(57) ABSTRACT

A contact element and a contact means comprising at least one contact element where the contact element comprises electrical contact means renders displaceable, such as translatable or rotatable, by a resilient means in which the conductor is at least partly embedded and through a surface of which the contacting means is exposed. This resilient means provides a contact element in which the contacting means may compensate for an unintentional displacement by one forcing the other in a given direction, via the resilient means. Also, the displacement may bring about a cleaning action between the contacting means. These means may be used both for disconnectable connections and rotatable, unconnnectable connections.

34 Claims, 10 Drawing Sheets

MEANS FOR PROVIDING ELECTRICAL CONTACT

This application is the national phase under 35 U.S.C. §371 of PCT International Application No. PCT/DK99/00229 which has an International filing date of Apr. 23, 1999, which designated the United States of America.

The present invention relates to a means for providing contact between one or more engaging means of a first means and a second means—and especially to a means for providing electrical and/or fluid contact.

Normally, when e.g. two electrical plugs are to be interconnected, a resiliency is desired between the engaging means of the plugs in order to provide a biasing between the engaging means and in order to have the interconnection adapt itself to small deviations in the relative positions of the engaging means.

Typically, that resiliency is provided by the engaging means themselves being constituted by e.g. sheath metal being resilient in itself. However, resiliency generated in that manner has a number of disadvantages derivable from the metal in that metals bent often, even though the deformation of the metal is within the elastic limit, will eventually experience metal fatigue and consequently break. Also, metal bent beyond the elastic limit will remain deformed in relation to its intended shape, where after interconnection may not be possible.

The present invention relates to a solution to that problem by in a first aspect providing a contact element comprising:

a housing or frame, an electrical or fluid conductor, an engaging means for engaging with an engaging means of another contact element, the engaging means being in electrical or fluid connection with the electrical or fluid conductor, where the element comprises a resilient means, the electrical or fluid conductor and the engaging means being at least partly embedded in the resilient means, and the engaging means being exposed at a surface part of the resilient means, the resilient means being adapted to render the engaging means displaceable in relation to the housing or frame.

In the present context, the "another" contact element may be of the type according to the first aspect of the invention or any other type adapted to engage the present contact element. The "another" contact element needs not have resilient engaging means, as a resiliency is provided by the present contact element.

Also, in this context, "a resilient means" is a means made of a material which is not totally stiff and hard. A resilient means may be a means made of a plastically compressible material, such as a friable foam, or an elastically compressible material, such as a rubber foam, or a plastically deformable material, such as clay, or an elastically deformable material, such as rubber or a silicone material. Deformable materials may be more or less compressible.

These materials have different properties and most of these are suitable for use indifferent embodiments of the contact element of the invention.

Preferably, the resilient means has a Shore A hardness below 65, such as below 60, such as below 55, such as below 50, such as below 45, such as below 40, such as below 35, such as below 30, such as below 35, such as below 30, such as below 25, such as below 20; such as below 15, such as below 10, such as below 5, and/or such as in the interval 1–40, such as in the interval 2–30, such as in the interval 5–20, such as in the interval 6–10, and/or such as in the interval 1–40, such as in the interval 4–30, such as in the interval 6–25, such as in the interval 10–20, and/or such as in the interval 1–40, such as in the interval 10–35, such as in the interval 15–32, such as in the interval 20–30, and/or such as in the interval 1–45, such as in the interval 15–43, such as in the interval 25–42, such as in the interval 30–40, and/or such as in the interval 1–60, such as in the interval 20–58, such as in the interval 30–55, such as in the interval 40–50; and/or such as in the interval 1–60, such as in the interval 20–60, such as in the interval 40–60, such as in the interval 50–60, and/or a 25% compression deflection (kg/cm $_2$) below 25 such as below 23, such as below 22, such as below 20, such as below 18, such as below 16, such as below 14, such as below 12, such as below 10, such as below 8, such as below 6, such as below 4, such as below 3, such as below 2, such as below 1, and/or such as in the interval 1–20, such as in the interval 1–15, such as in the interval 1–10, such as in the interval 1–5, and/or such as in the interval 1–20, such as in the interval 2–15, such as in the interval 2–12, such as in the interval 3–10, and/or such as in the interval 1–20, such as in the interval 2–18, such as in the interval 3–15, such as in the interval 5–12, and/or such as in the interval 1–24, such as in the interval 3–20, such as in the interval 5–17, such as in the interval 8–15, and/or such as in the interval 1–24, such as in the interval 5–23, such as in the interval 10–22, such as in the interval 12–20, and/or such as in the interval 1–24, such as in the interval 10–24, such as in the interval 15–23, such as in the interval 19–23.

However, as mentioned above, different materials falling within the different intervals and material types may be suitable for different embodiments of the invention.

Also, a "fluid contact" means that fluid may pass from the fluid conductor to the engaging means—and vice versa.

A "displacement" may be both a linear translations of the engaging means along a line and/or a rotation thereof around an axis. Normally, a combination thereof will be seen.

In one important embodiment of the first aspect, the contact element further comprises a second electrical or fluid conductor and a second engaging means in electrical or fluid connection with the second electrical conductor, the second electrical conductor and the second engaging means being at least partly embedded in the resilient means, and the second engaging means being exposed at a second surface part of the resilient means, the resilient means being adapted to render the second engaging means displaceable in relation to the housing or frame.

In this situation, the resilient means is preferably made of a non-conducting material, such as a silicone or a gel.

In this embodiment, the engaging means may be independently displaceable, or the displacement of one engaging means may depend on any displacement of the other engagement means. This dependency may be controlled by selecting a suitable material for the resilient material or by providing two separate resilient materials for the engaging means. A deformable material, such as rubber or a silicone material, having a relatively small compressibility, will be suitable for the generation of a dependent displacement in that a force generated by a displacement of one engaging means may be trans mitted by the deformable material to the other engaging means. This will be described in more detail below.

A compressible material is more suited for an independent displacement, as a displacement of one engaging means may generate a compression of parts of the resilient means. This compression may, however, not influence the parts of the resilient means contacting other engaging means of the element. Here, the compressibility or hardness of the material of the resilient means will depend on the force with which it is desired to bring about the electrical or fluid connection. If a large force is desired, a harder or less compressible material may be preferred, and vice versa. Normally, however, a hardness and/or compressibility at the middle of the broadest of the above-mentioned intervals may be preferred.

In one situation, the resilient means are further adapted to, when one engaging means is displaced in a predetermined direction, displace the other engaging means in another predetermined direction. In this situation, a deformable material may be preferred, and normally, the hardness thereof would be preferred in the lower half of the broadest of the above-mentioned intervals. Otherwise, it may be difficult to provide the force required to displace the material and move the other engaging means.

The directions in which the engaging means are displaced will, naturally, depend on the relative positioning of the engaging means in relation to each other and on the resilient means. However, it is preferred that if one engaging means is displaced in a direction into the resilient means, the other engaging means is displaced in a direction away from the resilient means. As will become clear below, this may be easily provided by using a resilient means of a material being at least substantially incompressible and limiting the expansion possibilities of the resilient means to areas around the engaging means.

In a second preferred embodiment of the first aspect, the contact element further comprises an element surface part, and wherein the resilient means is adapted to, when the element surface part is displaced in a direction at an angle to that of the element surface part and/or in a direction into the resilient means, displace the engaging means.

Thus, in addition to or instead of the dependent displacement between two or more engaging means, the displacement of the element surface part and one or more engaging means may be dependent. This has a number of advantages that will become clear in relation to the second aspect of the invention.

Preferably, the resilient means is adapted to, when the element surface part is displaced in a direction into the resilient means, displace the engaging means in a direction away from the resilient means. In order to bring about that effect, the hardness of the material should preferably be below the middle of the above-mentioned broadest intervals.

In a third preferred embodiment, the resilient means are adapted to render the engaging means rotatable around a rotation axis.

In one situation, the engaging means are adapted to render the engaging means rotatable around a rotation axis being at least substantially perpendicular to the surface part at which the engaging means are exposed.

In another situation, the engaging means are adapted to render the engaging means rotatable around a rotation axis being at least substantially parallel to the surface part at which the engaging means are exposed.

The actual axis of rotation will depend on the purpose of the rotation. This will be described in more detail with reference to the second aspect of the invention.

In yet another embodiment of the first aspect, the resilient element is at least substantially enclosed by an enclosing means, except for the surface part(s) at which the engaging means are exposed, and except for any element surface part of the resilient means.

Especially when the resilient means is at least substantially incompressible and at least substantially fills out a volume enclosed by the enclosing means, this is advantageous. In that situation, an optimum transfer of displacement and forces may take place between individual engaging means and any element surface parts. This will be described in more detail with reference to the second aspect of the invention.

In yet another embodiment of the first aspect of the invention, the resilient means and the engaging means are adapted to, when a force is applied to the engaging means in a predetermined direction at an angle to the surface part at which the engaging means is exposed, provide a displacement of the engaging means at an angle to the direction of the applied force.

This type of displacement of the engaging means is especially useful when a cleaning action is to be performed during engagement of the contact element with another contact element this will be described in relation to the second aspect of the invention.

In this situation, typically a part of the engaging means contacting the resilient means has a shape being unsymmetrical around a line extending in the direction of the applied force. In this situation, a resilient means having the same properties around the engaging means may be used, as the shape itself of the engaging means may facilitate the movement.

Otherwise or in addition, a resiliency characteristics, such as the Shore A value or the compression deflection, of the resilient means may vary along a circumference of the part of the engaging means.

In a second aspect, the invention relates to a contact means for establishing contact between two electrical or fluid conductors, the means comprising:

- a first contact element according to the first aspect of the invention, and
- a second contact element comprising an electrical or fluid conductor in electrical or fluid connection with an engaging means being exposed at a surface part of the second contact element, the first and second contact elements are adapted to engage in a manner so that the engaging means of the first and second elements engage and exert a force toward each other.

The force exerted between the first and second engaging means may be of any suitable size. When the force is exerted toward the parts, it is ensured that a useful electrical or fluid connection is obtained.

Thus, the action of the prior art engaging means in the force exertion is now replaced by a separate resilient means. Dividing these functions (electrical conducting and resilien cy) into two separate parts of the connector will provide the possibility of optimising both features independently of each other. In addition, dependent or independent displacements may be provided.

The problem of the prior art contact means may be seen when a number of e.g. electrical connections are to be provided within a single connector. In that situation, either the casing of the connector or the electrical conductors therein define the relative positions of the individual engaging means in the connector. If one engaging means is displaced from its intended position, it may not provide the electrical contact, when its counterpart is at its intended position. Also, if the displacement is in the direction of the counterpart, the increased engaging force thus exerted by this eng aging means and its counterpart may prevent other engaging means positioned at their intended positions from obtaining electrical or fluid contact.

In a first important embodiment of the second aspect, the first contact element further comprises an element surface part, and the resilient means is adapted to, when the surface contact part is displaced in a direction at an angle to that of the element surface part, displace the engaging means of the first element, the contact means additionally comprising means for displacing the element surface part of the first element in a manner so as to displace the engaging means of the first element.

In this manner, means are provided for displacing the element surface part and thereby the engaging means of the first element in order to e.g. obtain a suitable electrical or fluid connection with the engaging means of the second element.

It may be preferred that the displacing means are comprised in the second element, and it may be preferred that the displacing means are adapted to displace the element surface part when the engaging force is exerted. In this manner, when the two contact elements engage, the displacing means is operable and ensures the displacement of the engaging means and, thus, the electrical or fluid contact.

In fact, the displacing means may be adapted to, via the resilient means, cause at least part of the engaging force.

In contrast to the above embodiment, where the displacing means are operable during the actual engagement of the engaging means, it may be preferred that the displacing means are adapted to displace the element surface part subsequent to engagement of the engaging means of the first and second elements. A displacing means of this type may be a screw driving an element into the resilient means subsequent to engagement of the engaging means.

In another embodiment of the second aspect of the invention, the engaging means of the first element are adapted to, when engaging with a corresponding engaging means of the other element, be displaced in a direction at an angle to that of the force exerted.

Preferably, the engaging means of the first element is adapted to be displaced due to the engagement with the engaging means of the second element.

The engaging means of the first and second elements may be adapted to, during the displacement, be in physical contact so as to perform a cleaning action of the physically contacting surface parts thereof.

In this situation, an automatic cleaning of the contacting surface parts is performed. This is advantageous, as oxide layers or layers of dirt, dust etc. might otherwise form at the interface. Such layers reduce the quality of the electrical or fluid connection.

Preferably, the engaging means of the first element is adapted to be displaced during engaging and before the full engaging force is exerted. Otherwise, a separate operation might be required in order to provide the cleaning operation.

In one situation, the resilient means are adapted to render the engaging means of the first element rotatable around a rotation axis.

Exactly which axis would be the most suitable will depend on the shapes of the engaging means.

In one embodiment, the resilient means are adapted to render the engaging means of the first element rotatable around a rotation axis being at least substantially perpendicular to the surface part at which the engaging means are exposed.

In another embodiment, the resilient means are adapted to render the engaging means of the first element rotatable around a rotation axis being at least substantially parallel to the surface part at which the engaging means are exposed.

In either case, it is preferred that the engaging means of the first and second elements have contacting surface parts adapted to provide the rotation of the engaging means of the first element when the first and the second elements engage.

In this first embodiment, a resilient material may be preferred which has elastic properties in that these properties should bring the engaging means back to its initial rotational position subsequent to engagement of the elements. If this was not to happen, e.g. the cleaning action may not take place during a subsequent engagement.

In a second embodiment of the second aspect, the first element further comprises
- a second electrical or fluid conductor and
- a second engaging means in electrical or fluid connection with the second electrical or fluid conductor, the second electrical or fluid conductor and the second engaging means being at least partly embedded in the resilient means, the second engaging means being exposed at a second surface part of the resilient means, and the resilient means being adapted to render the second engaging means displaceable in relation to the housing or frame, the second element comprises
- a second electrical or fluid conductor and
- a second engaging means in electrical or fluid connection with the second electrical or fluid conductor, the second engaging means being exposed at a second surface part of the second element, the second engaging means being adapted to engage and exert a second force toward each other, when the first and second elements engage.

In this embodiment, the contact means is adapted to provide contact between two pairs of electrical or fluid conductors. Naturally, there may also be provided one pair of electrical conductors and one pair of fluid conductors.

In a first situation, each of the engaging means of the first element may be independently displaceable so as to e.g. provide the above-mentioned cleaning action.

However, a preferred way of operating this embodiment is one wherein the resilient means of the first element is adapted to ensure that the forces exerted by the engaging means have a predetermined relationship, such as that the forces are at least substantially the same, when the first and second elements engage.

In this manner, the displacements of or the forces exerted by the engaging means are made dependent through the operation of the resilient means. This relationship may vary depending on the dimensions of the first element and the properties, such as the resiliency and elasticity, of the resilient means. One requirement may simply be that the force exerted between two engaging means is larger than ON. A stricter requirement may be that the forces are at least substantially the same. In the last situation, the optimum electrical or fluid connection may be obtained between both sets of engaging means.

In addition to or instead of the force relationship requirement, the resilient means of the first element may be adapted to, when one or more of the engaging means of the second element is/are displaced in a predetermined direction in relation to its or their intended position(s), displace the engaging means of the first element accordingly.

Thus, if one or more of the engaging means of the contact means are displaced from their intended positions, the resilient means may act to still provide electrical of fluid connections by facilitating corresponding displacements of the engaging means of the first element.

In this second embodiment, an elastically deformable material may be preferred for use as the resilient means. The reason for this is that a transfer of force or displacement via the resilient means will be hampered if the engaging means were to not return to their initial positions. In addition, the actual transfer of force or displacement will depend on e.g. the compressibility of the material. A material having a large compressibility may not transfer the force or displacement sufficiently, as the material surrounding the engaging means exerting the force or experiencing the displacement may itself take up the force or displacement and consequently not transfer it to the other engaging means.

Naturally, independently of the specifics of the above embodiments of the second aspect, the first element and the second element may be adapted to releasably engage by means of a screwing action, a fast lock action, a clicking action, friction, magnetic or electric forces, gravity, or using a dove tail shaped engaging function.

Alternatively, the first and second elements may be interconnected in a manner so that they may be rotated in relation to each other around an axis of rotation, and one of the first and second contact elements may be shaped as at least a part of a circle, the circle having a centre at least substantially coincident with the rotation axis.

In this manner, the connection is provided in a rotatable manner while retaining the advantages provided by the resilient means.

In that situation, the second contact element(s) is/are preferably shaped as the at least part of a circle, so that this or these elements may be formed by conventional means and the inventive connecting means may be used only as small-area connectors.

This type of rotatable connector may, naturally, be provided both in a detachable type and one wherein the first and second elements are interconnected in an at least substantially permanent manner.

It should be noted that the connecting means or connecting element may comprise any number of electrical or fluid conductors and engaging means. Also, they may comprise a number of electrical conductors and engaging means in a single or in a number of separated resilient means. In that manner, the properties of the connecting means and the connecting element may be designed by e.g. selecting different materials for the resilient means.

Also, it should be noted that the present connecting means and connecting element is equally suited for connecting lines or tubes for fluids, liquids, gasses or the like, in that the adapting properties of the engaging means are highly desired for that purpose. In fact, it would be possible and for a number of applications, such as in the dental field, desired to provide plugs adapted to transfer both electrical currents or signals and fluids.

Especially when certain Silicones are used, the connecting means and connecting element of the invention is suitable in that special situation where it is desired cleaned by autoclaving in order to clean it. This is the situation in dental or surgical equipment.

Presently, autoclaving a standard electrical plug, the high pressure steam will travel from the plug into the electrical cords between the electrical conductor and the insulator. In that manner, the electrical cord will quickly be rendered useless—and the plug may receive the water and, thus, be rendered useless.

Using Silicones, it has been experienced that the connecting element may be sufficiently sealed between the exposed engaging means and the electrical conductors to prevent that effect. Thus, the present invention also provides a means and an element which may be used in connection with power or fluid demanding equipment which is desired cleaned by autoclaving.

Consequently, the skilled person would easily be able to gather the demands to put to the resilient means—and to have the resulting material, such as a silicone, manufactured—such as from General Electric Silicones, USA.

Also, an advantage of materials of that type is that they may be moulded around the conductors and engaging means. Moulding the resilient means may ensure a better adhering thereto and consequently a better sealing function—as well as a better filling of any enclosing means. Also, using a moulding operation may facilitate the forming of other elements, such as sealing elements, in the means; sealing elements may be preferred when fluid connections are to be formed.

In the following, a number of preferred embodiments of the present contact means and contact element are described with reference to the drawing wherein:

FIG. 1A is a cross section of a prior art contact means,

FIG. 1B is a cross section of a first embodiment of a contact means according to the invention, FIG. 2 is a cross section of the contact means of FIG. 1B illustrating the adapting capabilities of this embodiment, FIG. 3 illustrates cross sections and end views of the first and second elements of a second embodiment of the contact means according to the invention, FIGS. 4A–4D illustrate cross sections of different embodiments of engaging means, FIGS. 5A–D illustrate a third embodiment of the contact means of the invention, FIG. 6 illustrates end views and side views of a fourth embodiment of the contact means according to the invention, FIG. 7 illustrates two cross sections of a fifth embodiment of the contact means according to the invention as well as a top view of an engaging means thereof, FIGS. 8A and 8B illustrate a cross section and a 3D side view, respectively, of a contact element according to the invention, where the engaging means are of the type illustrated in FIG. 4A, and FIG. 9 illustrates another embodiment of a contact means according to the invention with yet another interesting shape of the engaging means.

Figure 1A:
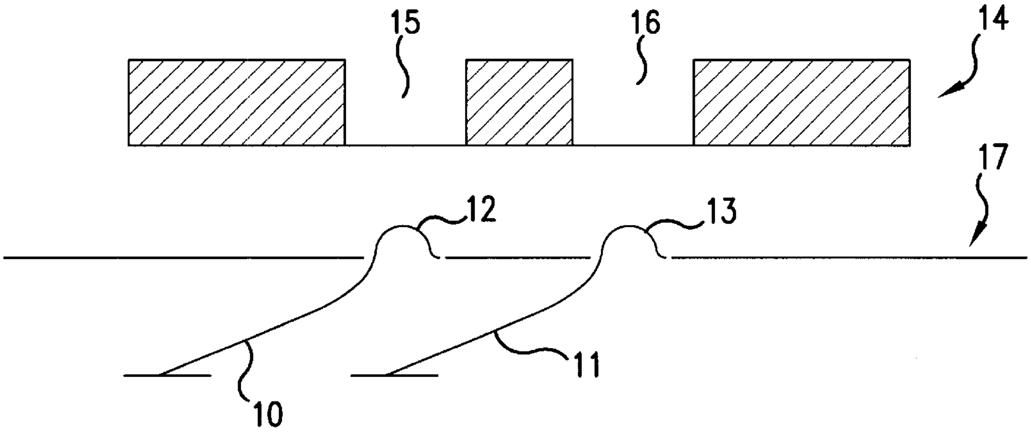
FIG.1A PRIOR ART
FIG. 1B illustrates in a simple manner the advantages of the contact means and elements of the invention.

In FIG. 1A, a prior art electrical contact means is illustrated where the resiliency is provided by metallic conductors 10 and 11 of a first element 17 and being connected to engaging means 12 and 13. Typically, the conductors 10 and 11 are fastened at one end and extend therefrom without further support.

A second element 14 comprises engaging means 15 and 16 for providing electrical contact with the means 12 and 13, respectively.

It is seen that a displacement of one of the means 12, 13, 14, or 15 may easily cause that electrical contact is not provided. Also, metallic fatigue may eventually cause one of the conductors 10 and 11 to break, even though none of these have been excessively bent during use.

Figure 1B:
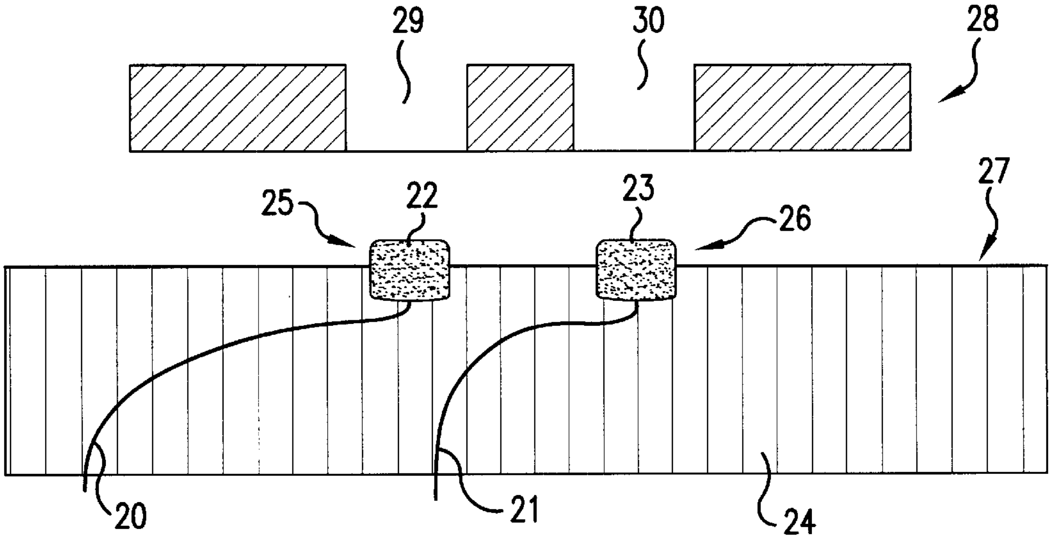

FIG. 1B illustrates a simple embodiment of a contact means and contact element of the invention.

This embodiment comprises a first element 27 according to the invention and having two electrical conductors 20 and 21 connected to engaging means 22 and 23, respectively. The conductors 20 and 21 are embedded in a resilient means 24 through two surface parts 25 and 26 of which the engaging means 22 and 23 extend, respectively.

A second element 28 comprises, as is the case in FIG. 1A, two engaging means 29 and for providing electrical contact with the engaging means 22 and 23, respectively, of the first part 27.

Due to the operation of the resilient means 24, the electrical conductors 20 and 21 are not responsible for generating the resiliency, whereby these conductors may be made of a material and/or of dimensions more suitable for a large number of bendings/displacements without having to take into account the resulting interengaging. force of the engaging means 22, 23, 29, and 30.

Figure 2:
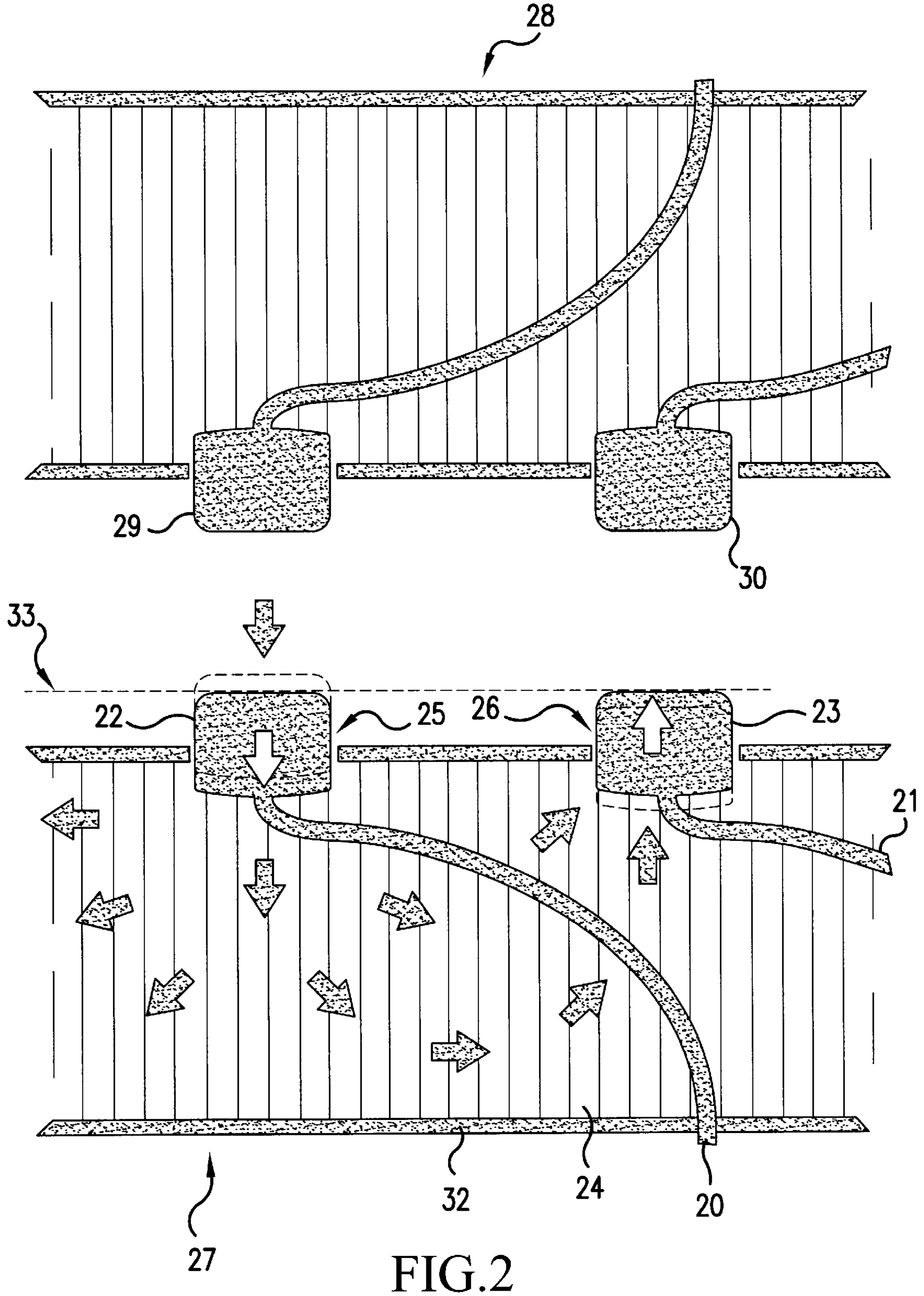

A very interesting modification of the first embodiment of FIG. 1B may be seen in FIG. 2 where the resilient means 24 has been encapsulated in an enclosing means 32, such as a box of steel.

In this embodiment, the enclosing means 32 is substantially filled with the resilient means 24. Openings substantially corresponding to the cross sections of engaging means 22 and 23 have been provided at the surface parts 25 and 26 in order for the engaging means 22 and 23 to extend outside the en closing means 32.

The function of the enclosing means 32 may be seen when, as is the situation in FIG. 2, the engaging means 22 of the first element 27 is displaced toward the engaging means 29 of the second element 28. It should be noted that even though the second element 28 in FIG. 2 is of the same type as that of the first means 27 (i.e. with a resilient means), this needs not be the case. Any type of second element 28 may be used.

When engaging the first and second elements 27 and 28, respectively, the displaced engaging means 22 will be displaced by the engaging means 29 in a direction into the resilient means 24. The starting positions of the engaging means 22 and 23 are illustrated by dashed contours. The resilient means 24 being enclosed by the enclosing means 32 will act (see the arrows) to push the engaging means 23 toward the engaging means 30. In this manner, optimal contact between the engaging means may be obtained even though one of these means has been displaced.

Depending on the resilient characteristics of the means 24, the force exerted between the first and second elements 27 and 28 will be the same or substantially the same as if the engaging means 22 was not displaced. It should be noted that this adapting property is equally useful if one of the engaging means of the second element was displaced. This, naturally, will act to decrease the demands as to the precision when manufacturing the elements.

Figure 3:
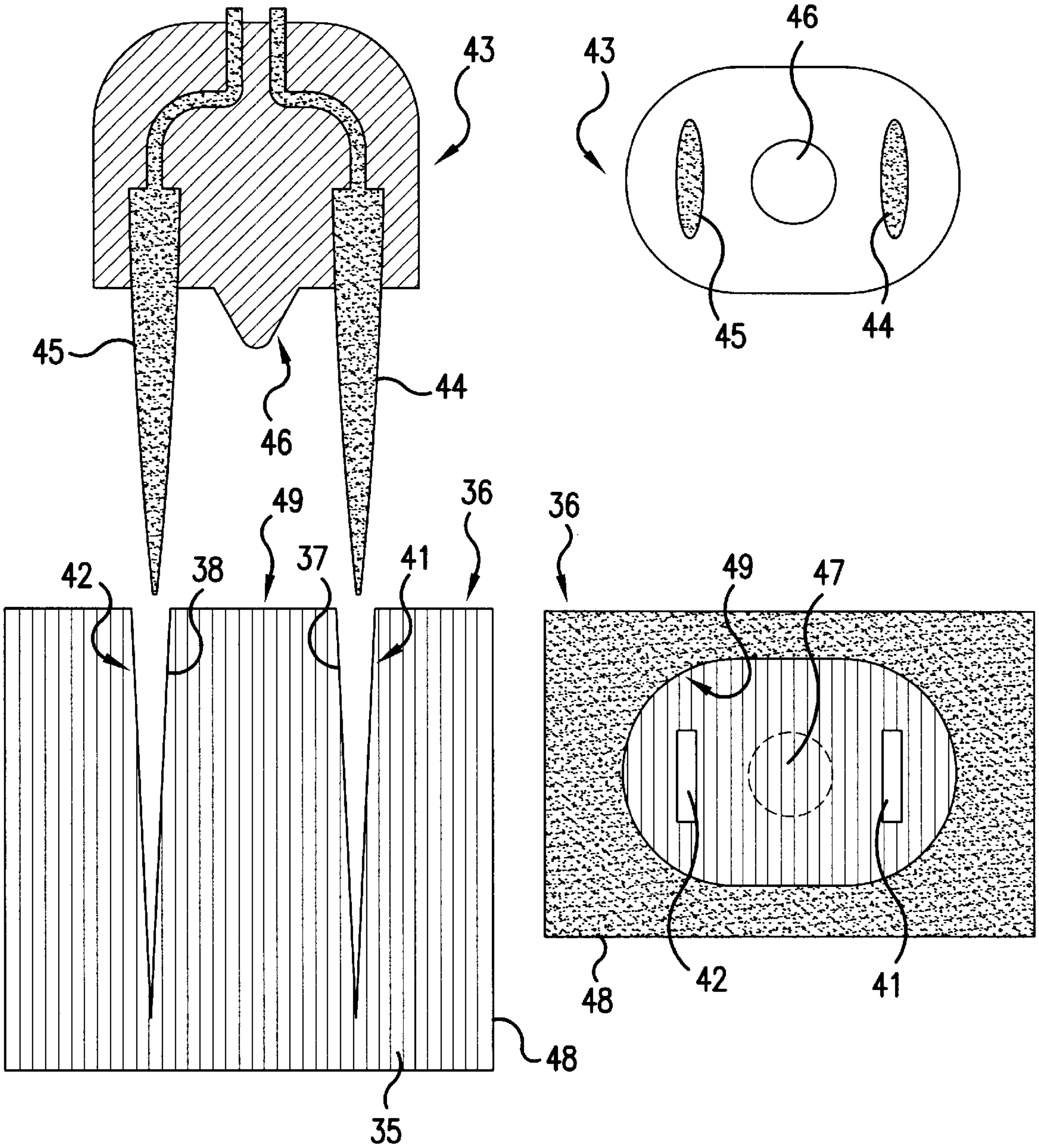

In FIG. 3, a second embodiment of a contact means is illustrated. In this embodiment, the resiliency of a resilient means 35 of a first element 36 is used in a manner different from that in FIG. 2.

In FIG. 3, the first element 36 comprises two engaging means 37 and 38 positioned at and exposed at surface parts 39 and 40 of holes 41 and 42 therein.

The second element 43 comprises two engaging means 44 and 45 for engaging the engaging means 37 and 38, respectively, by entering the holes 41 and 42, respectively.

Also, the second element comprises a means 46 adapted to displace an element surface part 47 of the resilient means 35.

The resilient means 35 of the first element 36 is enclosed in an enclosing means 48 having an opening 49 (see the top view) enclosing the holes 41 and 42 (and thereby the surface parts 39 and 40) as well as the element surface part 47. Consequently, engaging the first and the second elements, 36 and 43, will enter the engaging means 44 and 45 into the holes 41 and 42, respectively, and bring these into engagement with the engaging means 37 and 38, respectively. Also, at the end of this movement, the means 46 will displace the element surface part 47 and thus part of the resilient means 35, whereby at least part of the holes 41 and 43 and the engaging means 37 and 38 therein will be displaced toward the engaging means 44 and 45.

In that manner, the operation of the means 46 will ensure a good electrical/fluid connection between the engaging means—by effectively narrowing the holes.

Also, this "squeezing" operation during introduction of the means 44 and 45 in the holes 41 and 42 will act to clean the surfaces of the engaging means 37, 38, 44, and 45.

This cleaning action is also illustrated in FIGS. 4A–4D where different cross sectional shapes of engaging means are illustrated.

Figure 4A:
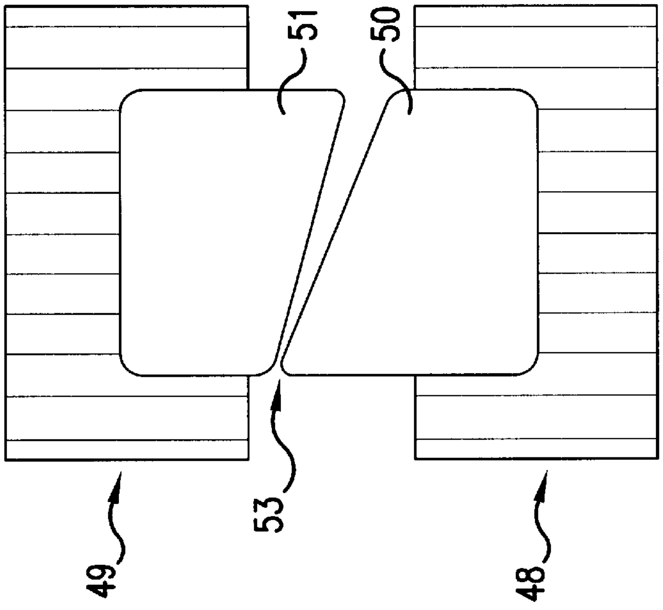

The overall operation may be seen from FIG. 4A where a first element 48 and a second element 49 comprise engaging means 50 and 51, respectively. The first element also comprises a resilient means 52. The second element 49 may or may not be of the same type.

It is seen that the shapes of the engaging means are so that a good electrical connection may be obtained over a surface thereof, but that the positioning thereof (rotation thereof) is such that this will only be the case after a rotation of one or both engaging means 50, 51.

Due to the resiliency of the resilient means 52, this rotation or movement may automatically take place during engagement of the first and second elements.

During engagement, firstly the means 50 and 51 will engage at a small area 53—thereby preventing sparks. During subsequent engagement where the first and second elements are pushed into further engagement, this area will increase by rotation of the means 50. Finally, the engagement may cause that the full, flat, areas of the means 50 and 51 are in contact. Subsequent to that, any further pressure between these means may cause the means to displace along a direction of the plane there between, whereby a cleaning action of the surfaces will take place.

Figure 4B:
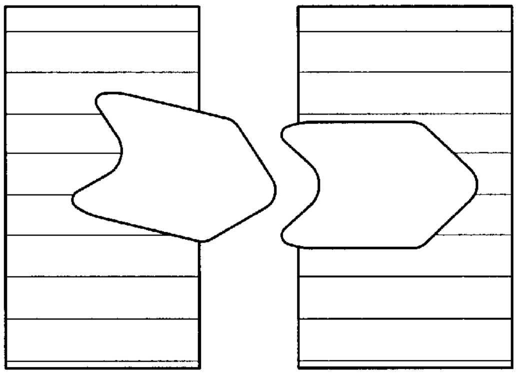
Figure 4C:
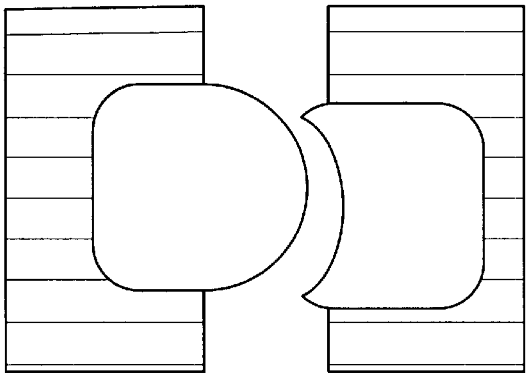
Figure 4D:
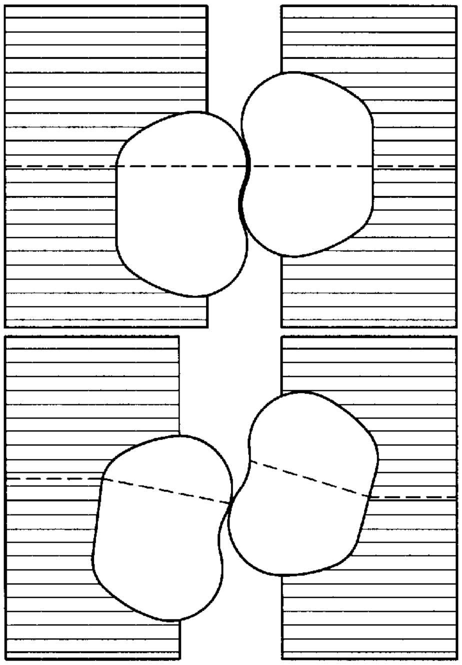

In FIGS. 4B–4D, the same action will be seen. However, it is seen that the cleaning action will not clean the full contacting surfaces of the engaging means In FIG. 4D, the operation is illustrated of a contact means where both the first and the second element are of the type having a resilient means.

Figure 8A:
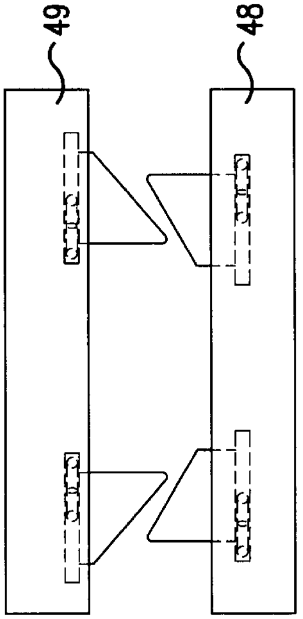
Figure 8B:
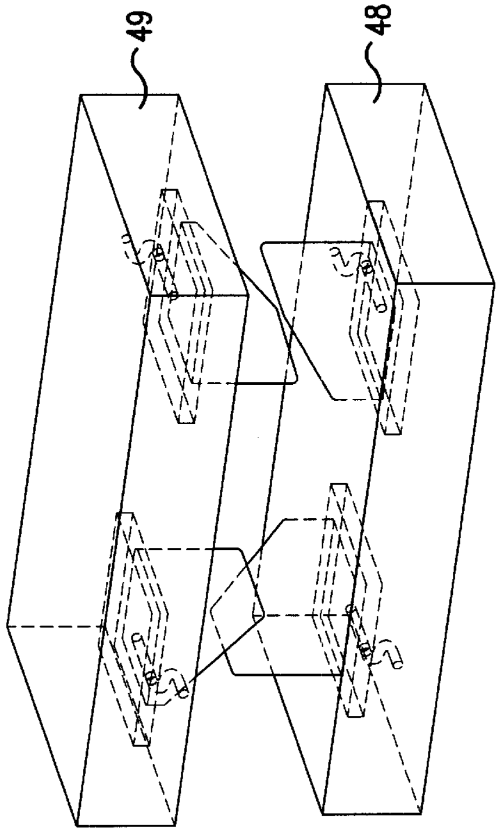

In FIG. 8, a contact element is illustrated having engaging means as those of FIG. 4A. In this embodiment, two sets of engaging means are provided—in a mirrored fashion. In this manner, the horizontal force automatically generated from the interaction of the engaging engaging means in FIG. 4A is compensated for by the mirroring of two at least substantially identical sets of engaging means. Otherwise, a housing or the like would preferably be provided for handling this force which would otherwise tend to disengage the engaging means.

Figure 5A:
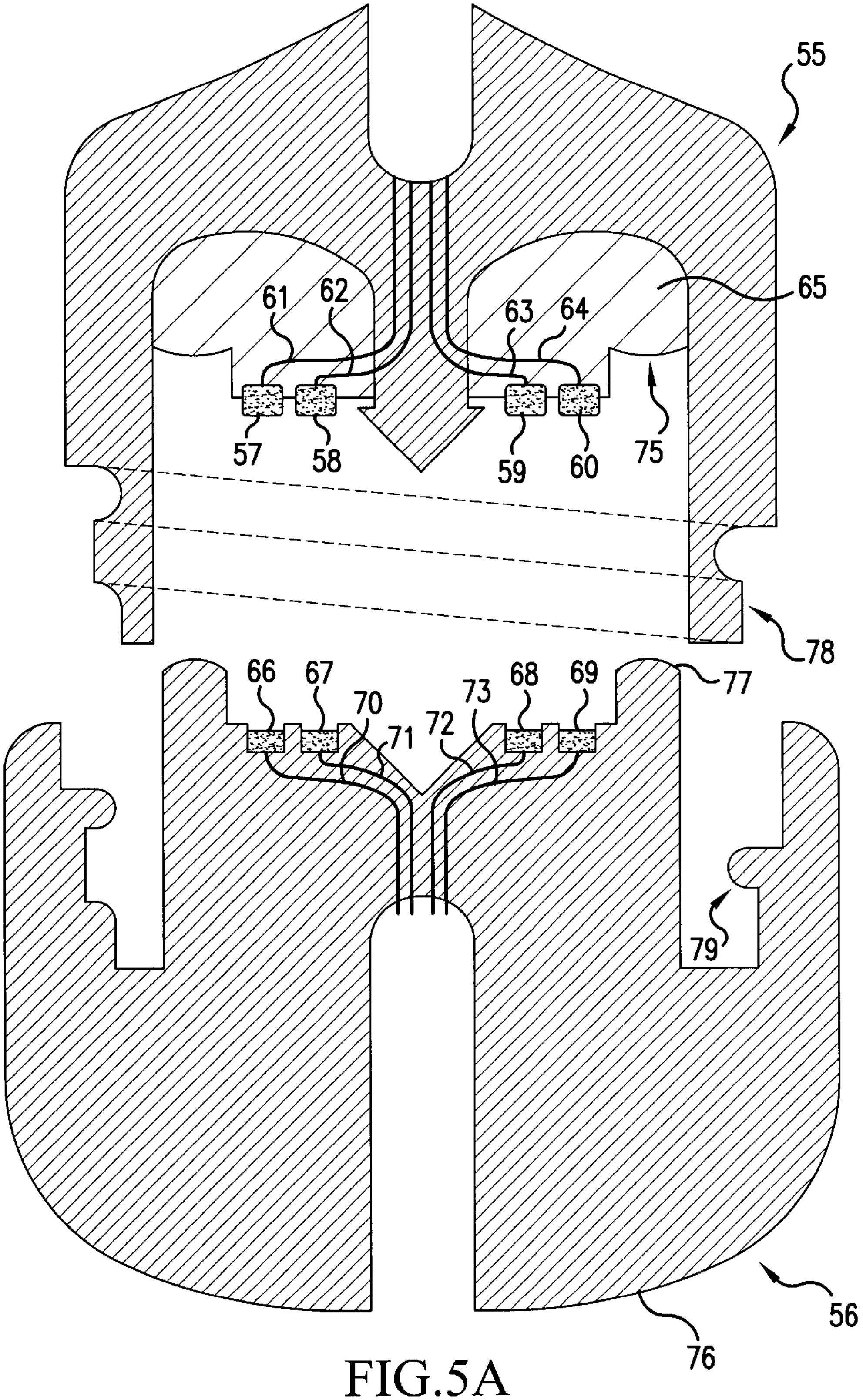
Figure 5C:
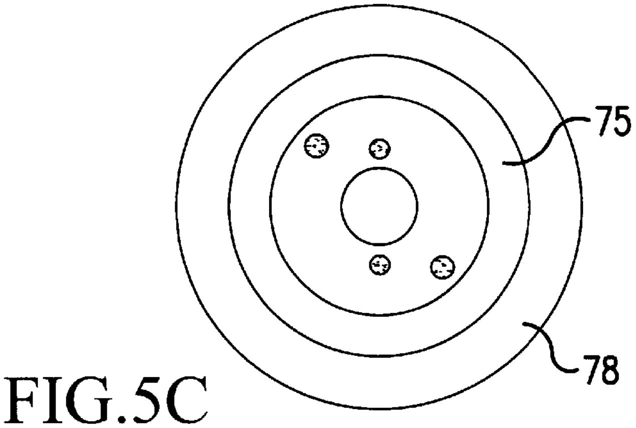
Figure 5B:
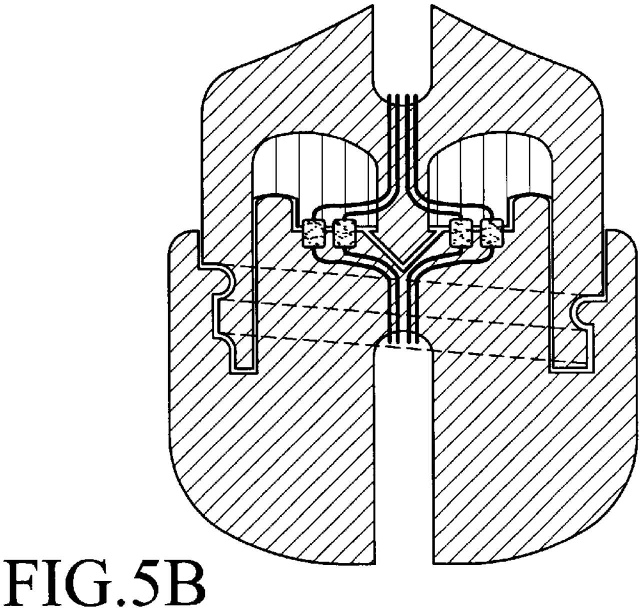

In FIGS. 5A and 5B, cross sections of a contact means according to the invention are seen, where, in FIG. 5A, the first and second elements are disengaged and, in FIG. 5B, engage.

In this embodiment, not only the parts of the contact means having the resilient means and the engaging means are illustrated but also a casing having a thread for maintaining the engagement of the first and second element.

More specifically, this embodiment comprises a first element 55 and a second element 56. The first element comprises four engaging means 57–60 and four electrical conductors 61–64 connected thereto, respectively. Also, a resilient means 65 is provided.

The second element 56 comprises four engaging means 66–69 for engagement with the means 57–60, respectively, being connected to one of four electrical conductors 70–73, respectively.

Also, the resilient means 65 is enclosed by a casing of the first element 55 except for at the surface parts of the resilient means 65 through which the engaging means 57–60 extend and for a circular contact area 75 surrounding the center of the first element holding the engaging means.

The housing 76 of the second element 56 comprises a circular contacting member 77 adapted to engaging the resilient means 65 at the contact area 75 when the first and second elements 55 and 56 engage.

The operation of this embodiment is as follows:

When bringing the first element 55 and the second element 56 into contact, the contacting element is positioned within a circular collar 78 of the first element 55. This circular collar 78 comprises an outer thread for interengaging with an internal thread 79 provided in the housing 76 of the second element.

When rotating the first and second elements in relation to each other, the distance between the engaging means will be reduced, as will be the case with a distance between the contact area 75 and the contacting member 77.

When the engaging means and the contact area/contacting member engage, the resilient means will act to force the engaging means into engagement—independently of any of them being displaced from their intended positions, due to the pressure of the member 77 on the resilient means 65 at the area 75.

Also, if the elements 55 and 56 are slightly rotated while the engaging means are in contact, the above-mentioned cleaning action will take place. From FIG. 5C it is seen that the engaging means of the first element 55 have a small area, where the engaging means of the second element 56, as is illustrated in FIG. 5D, each are exposed with a surface of part of a circle so as to constantly contact the engaging means of the first element during the cleaning operation.

Figure 5D:
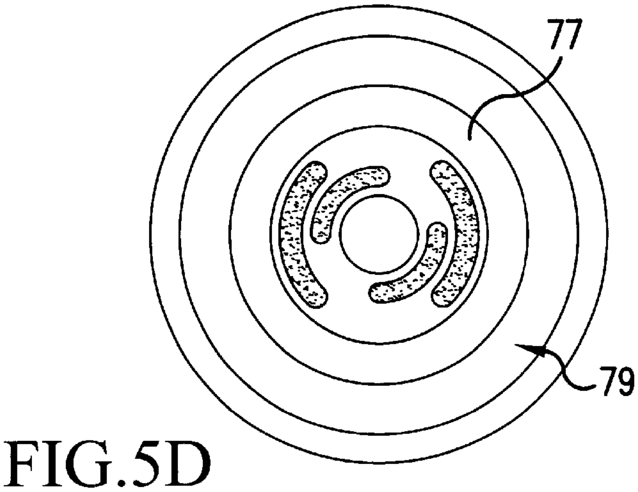

The cross sections of FIGS. 5A and 5B illustrate the engaging means as being positioned on a straight line, where FIGS. 5C and 5D do not. This, however is merely a choice to be made by the skilled person: how are the engaging means to be positioned within the housings.

An interesting aspect of this embodiment is one which is not primarily focussed on elements which are adapted to be attached and detached but to provide a continuous contact during rotation of one element in relation to the other.

Figure 10:
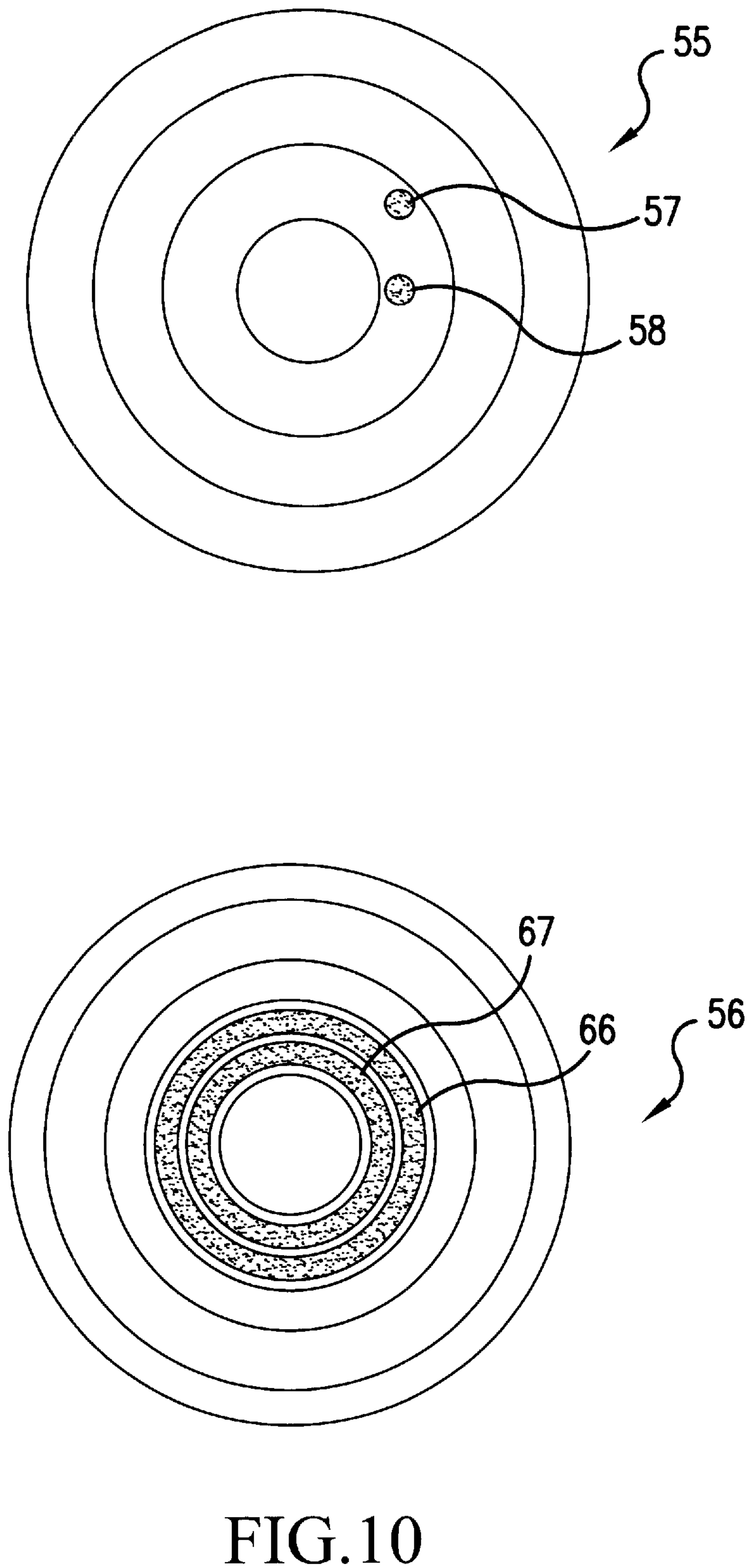
FIG. 10 illustrates an embodiment similar to that of FIG. 5 but adapted to be rotatable.

This aspect is illustrated in FIG. 10, where it is seen that the engaging means of the first element 55 are still small, whereas those of the second element 56 are now circular to maintain contact between the elements during a full circle of rotation.

This type of connection may be used in a number of applications, such as applications where the elements 55 and 56 are connected to non-flexible parts so that the rotation is required to take place between the elements 55 and 56.

In that situation, the elements may be interconnected by a clicking action not adapted to be easily disconnected or simply by e.g. a screw and a bolt.

Figure 6:
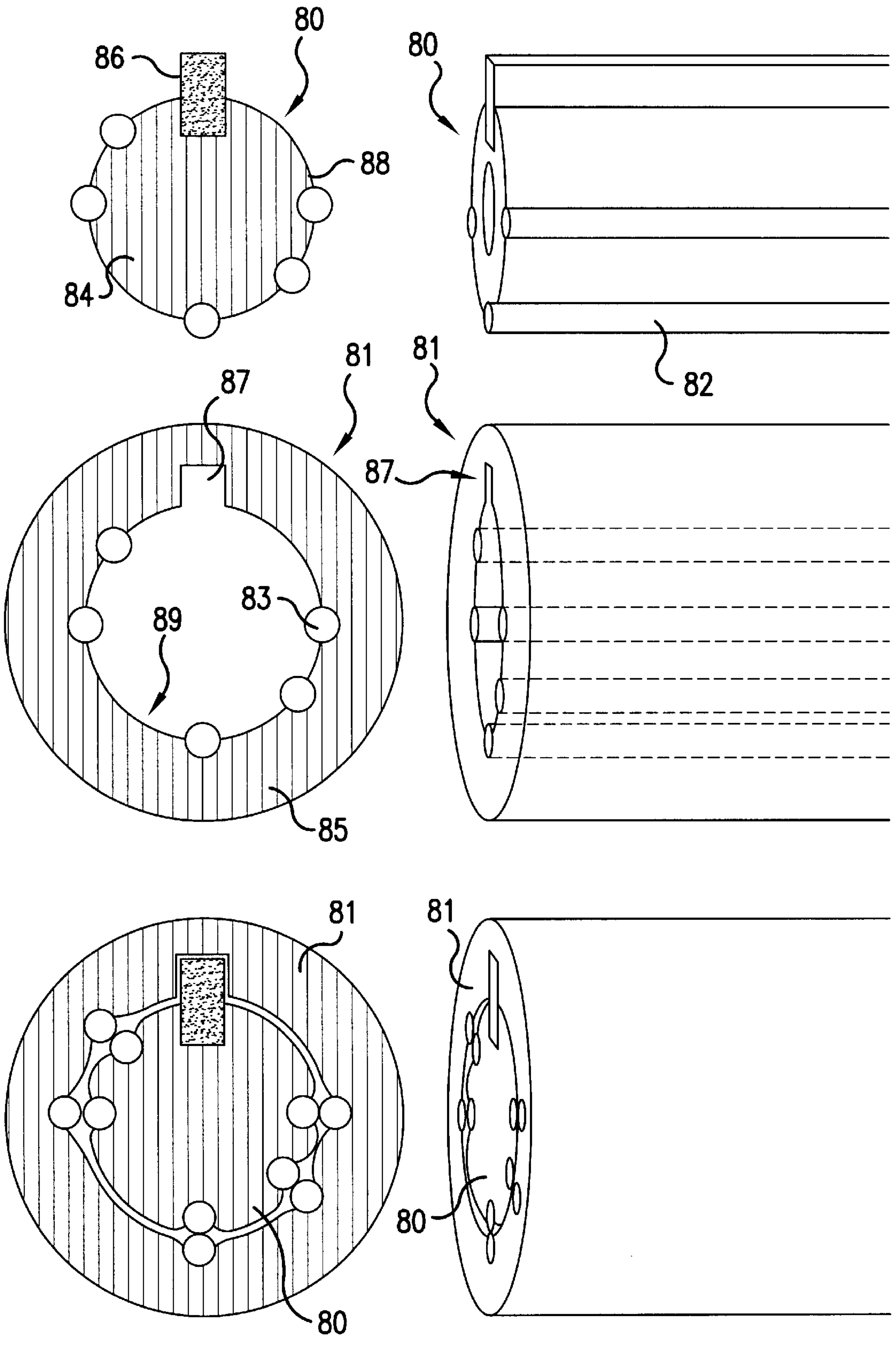

A fourth embodiment is illustrated in FIG. 6 where a first element 80 and a second element 81 are illustrated as a rod-like means and a tube-like means, respectively.

The first element 80 comprises a number of engaging means 82 provided parallel to a length axis thereof and at an outer surface thereof. These means 82 are partly embedded in the first element 80 and partly extend from the outer surface thereof.

The second element 81 is provided with a number of engaging means 83 provided parallel to a length axis thereof and at an inner surface thereof. Also these means are partly embedded in the second element 80 and partly extend from the inner surface thereof.

As is clear from the bottom illustration in FIG. 6, the dimensions of the first and second elements, 80 and 81, are so that when the first element is positioned within the second element, the engaging means thereof engage.

Also, it is seen that both the first element 80 and the second element 81 comprise a resilient means 84 and 85, respectively, so that, when engaging, the engaging means are displaced in a direction into the resilient means. Only one of the elements needs, however, be of the type according to the invention comprising a resilient means.

In addition, the first element 80 comprises a steering member 86 fitting into a steering slit 87 provided at the inner surface of the second element 81. These steering means act to prevent relative rotation of the first and second elements 80 and 81. Such rotation might bring the engaging means out of engagement.

In order to facilitate introduction of the first element 80 into and removal thereof from the second element 81, one or both of these elements may comprise an enclosing means (illustrated as reference numerals 88 and 89, respectively) which covers the material of the resilient means 84 and 85—at the surface thereof toward the other element 80, 81—except for around the engaging means.

Figure 7:
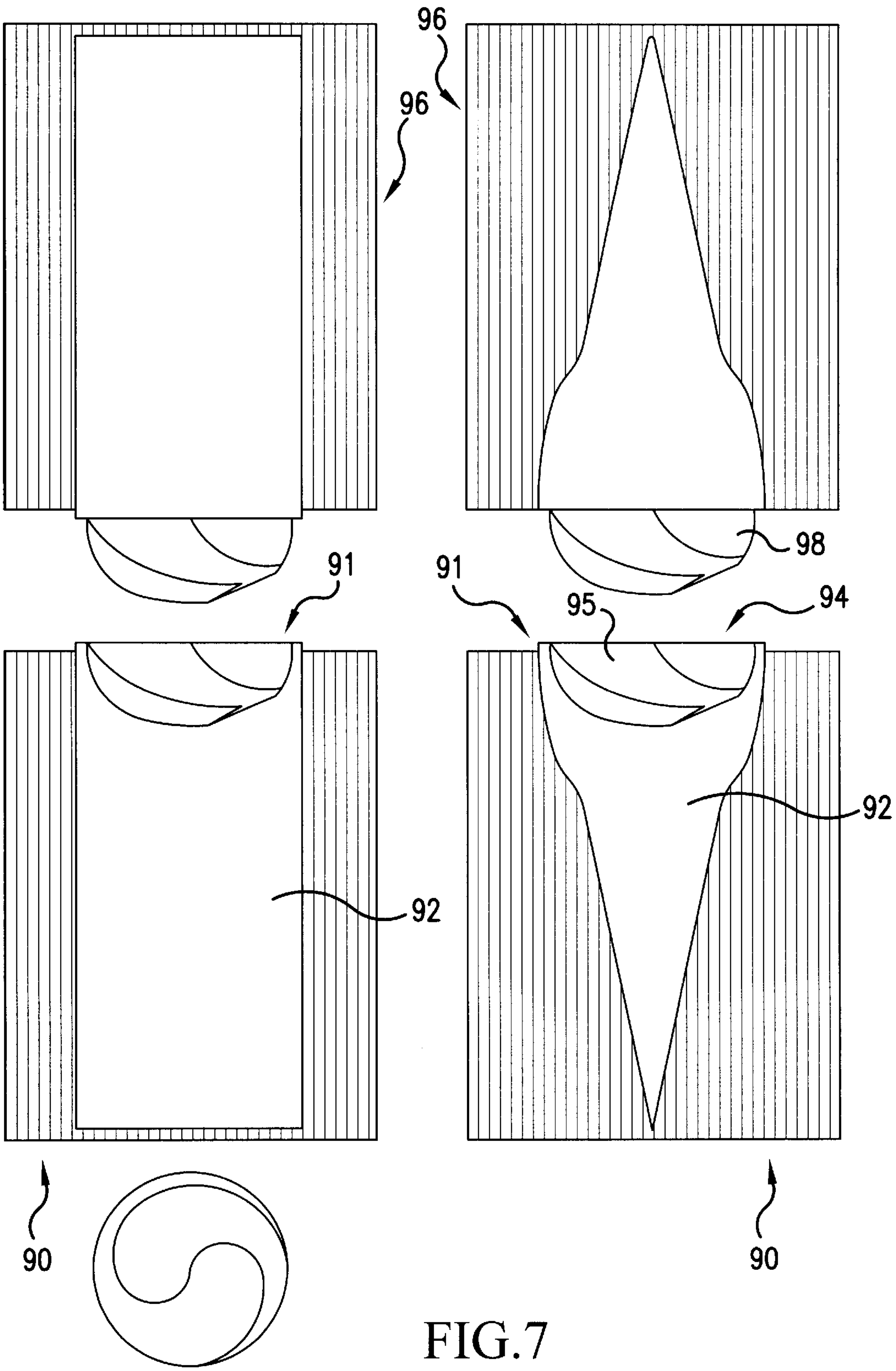

FIG. 7 illustrates a fifth embodiment of the connecting means and element of the invention. This figure illustrates two cross sectional shapes taken at right angles through a center line of engaging means. In this embodiment, a complex shape of the engaging means is illustrated.

A first element 90 comprises an engaging means 91 having a base 92 embedded in a resilient means 93. The base 92 has a flat, cone-like shape (like the shape of the tip of a screw driver).

The engaging part 94 of the element 90 has a hole-like shape comprising a number of at least substantially flat or plane surface parts 95 extending both radially and longitudinally from the center thereof.

The second element 96 has an engagement means 97 having a complementary shape also with a number of at least substantially flat or plane surface parts 98 extending both radially and longitudinally from the center thereof.

It is clear that when these two engaging means are brought into engagement, from initial positions where the surface parts 95 and 98 are slightly rotated, the engaging means of the first element—and of the second element if that is also an element according to the invention—will be rotated in order for the surface parts to maintain engagement and as a result of the increasing force.

Thus, this engagement and movement of the surface parts 95 and 98 may perform a cleaning action.

It should be noted that the number of surface parts 95 or 98 may be selected depending on the actual requirement. The surface parts 95 and 98 may comprise electrical conductors or fluid conductors—or both. The two engaging means may be adapted to provide a number of both electrical and fluid connections.

Naturally, the surface parts 95 and 98 could be chosen to only extend in the radial direction of the engaging means. However, in that situation, any rotation or displacement provided of the engaging means will not perform a cleaning action of all surface parts 95 or 98 of the engaging means.

In any case, the shapes of the engaging means will provide an adaptation to unintentional displacements of the engaging means in a direction at an angle to the center axes thereof.

Figure 9:
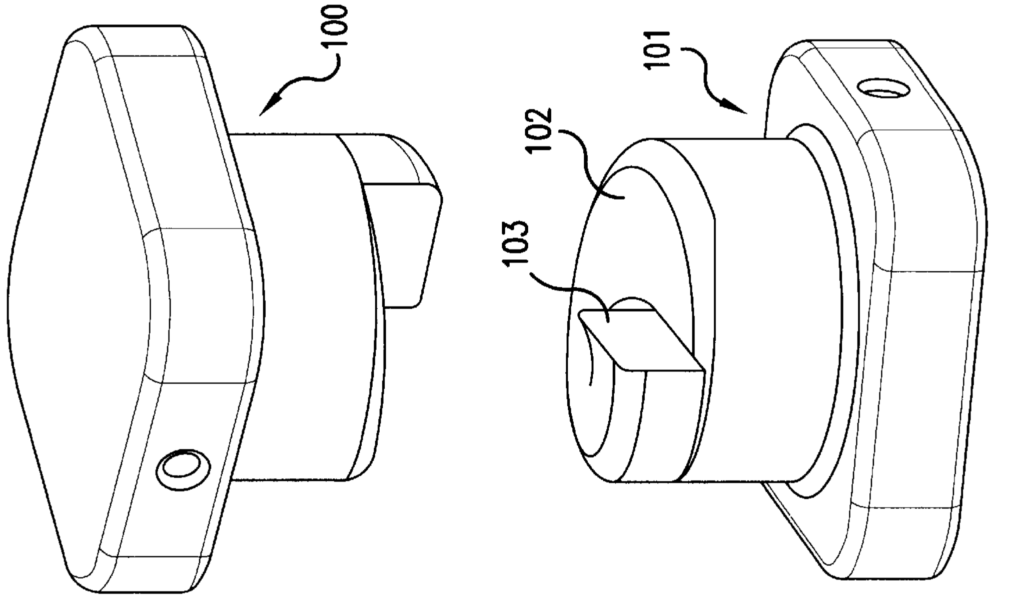

Finally, in FIG. 9, yet another embodiment of engaging means for use in the element and means according to the invention is illustrated.

In this embodiment, a first contact element 100 is one according to the invention, where a second contact element 101 needs not be so. The engaging means of the first element 100 is embedded in a resilient means (not illustrated) in a manner so as to be rotatable around an axis which is essentially vertical in FIG. 9.

The engaging means are at least substantially identical and comprise an engaging surface 102 which extends circumferentially and longitudinally and is radially flat. Also the engaging surface comprises a surface 103 extending in the longitudinal direction.

Before engagement, the two engaging means would be positioned slightly rotated (the bottom engaging means would be rotated with the clock seen from above) away from the angle wherein the surfaces 103 would engage, if the engaging means were engaging.

When engaging, the engaging force would force the engaging means to rotate in the direction where the surfaces 103 would engage. This has two effects: the rotation will provide a cleaning action of the surfaces 102, and, if the rotation is maintained until the surfaces 103 do, in fact, engage, a very good engagement is obtained.

This manner of ensuring that the engagement is stopped and "maintained" at a well defined relative positioning between the engaging means has the advantage that the surfaces 102 and 103 may comprise a number of electrical and/or fluid conductors, whereby a number of connections may be provided by a single pair of engaging means.

In the above described preferred embodiments of the invention, mostly electrical connections and connectors have been described. However, it should be noted that the invention and embodiments are equally suited for providing fluid connections. In that situation, the engaging means would, instead of electrical means, have means for providing fluid connections. In this respect, the engaging means may be desired to comprise sealing means in order to fully prevent the fluid from escaping at the connection. Naturally, these sealing means may be formed as a part of the resilient means.

What is claimed is:

1. A contact element comprising:

a housing or frame, a first and a second electrical or fluid conductor, first and second engaging means for engaging with an engaging means of another contact element, the first and second engaging means being in electrical or fluid connection with the first or second electrical or fluid conductor, respectively, resilient means, the first and second electrical or fluid conductors and the engaging means being at least partly embedded in the resilient means, and the first and second engaging means being exposed at a first and a second surface part, respectively, of the resilient means, the resilient means being adapted to render the engaging means displaceable in relation on to the housing or frame, enclosing means, the resilient means being at least substantially enclosed by an enclosing means, except for at least one surface part at which the engaging means are exposed, the resilient means being at least substantially incompressible and at least substantially fills out a volume enclosed by the enclosing means, the enclosing means limiting the expansion possibilities of the resilient means to areas around the engaging means, and the resilient means and the enclosing means being operable to, when one engaging means is displaced in a direction into the resilient means, push the other engaging means in a direction away from the resilient means.

2. The contact element according to claim 1, wherein the resilient means has a Shore A hardness below 65.

3. The contact element according to claim 1, wherein the resilient means has a 25% compression deflection, ($kg/cm_2$) below 25.

4. The contact element according to claim 1, further comprising an element surface part, and wherein the resilient means is adapted to, when the element surface part is displaced in a direction at an angle to that of the element surface part and/or in a direction into the resilient means, displace the engaging means.

5. The contact element according to claim 4, wherein the resilient means is adapted to, when the element surface part is displaced in a direction into the resilient means, displace the engaging means in a direction away from the resilient means.

6. The contact element according to claim 4, wherein the resilient element is at least substantially enclosed by an enclosing means, except for the at least one surface part and except for the element surface part of the resilient means.

7. The contact element according to claim 1, wherein the resilient means are adapted to render the engaging means rotatable around a rotation axis.

8. The contact element according to claim 7, wherein the engaging means are adapted to render the engaging means rotatable around a rotation axis being at least substantially perpendicular to the surface part at which the engaging means are exposed.

9. The contact element according to claim 8, wherein the engaging means are adapted to render the engaging means rotatable around a rotation axis being at least substantially parallel to the surface part at which the engaging means are exposed.

10. The contact element according to claim 1, wherein the resilient means and the engaging means are adapted to, when a force is applied to the engaging means in a predetermined direction at an angle to the surface part at which the engaging means is exposed, provide a displacement of the engaging means at an angle to the direction of the applied force.

11. The contact element according to claim 10, wherein a part of the engaging means contacting the resilient means has a shape being unsymmetrical around a line extending in the direction of the applied force.

12. The contact element according to claim 10, wherein a resiliency characteristic of the resilient means varies along a circumference of the part of the engaging means.

13. The contact element according to claim 12, wherein the resiliency characteristic is resiliency or compressibility.

14. A contact means for establishing contact between two electrical or fluid conductors, the means comprising:

a first contact element having:

a housing or frame, a first and a second electrical or fluid conductor, first and second engaging means for engaging with an engaging means of another contact element, the first and second engaging means being in electrical or fluid connection with the first or second electrical or fluid conductor, respectively, resilient means, the first and second electrical or fluid conductors and the engaging means being at least partly embedded in the resilient means, and the first and second engaging means being exposed at a first and a second surface part, respectively, of the resilient means, the resilient means being adapted to render the engaging means displaceable in relation to the housing or frame, enclosing means, the resilient means being at least substantially enclosed by an enclosing means, except for at least one surface part at which the engaging means are exposed, the resilient means being at least substantially incompressible and at least substantially fills out a volume enclosed by the enclosing means, the enclosing means limiting the expansion possibilities of the resilient means to areas around the engaging means, and the resilient means and the enclosing means being operable to, when one engaging means is displaced in a direction into the resilient means, push the other engaging means in a direction away from the resilient means, two second contact elements comprising an electrical or fluid conductor in electrical or fluid connection with two engaging means being exposed at a surface part of the second contact element, the first and second contact elements being adapted to engage in a manner so that the engaging means of the first and second elements engage and exert a force toward each other.

15. The contact means according to claim 14, wherein the first contact element further comprises an element surface part, and wherein the resilient means is adapted to, when the surface contact part is displaced in a direction at an angle to that of the element surface part, displace the engaging means of the first element, the contact means additionally comprising means for displacing the element surface part of the first element in a manner so as to displace the engaging means of the first element.

16. The contact means according to claim 15, wherein the displacing means are comprised in the second element.

17. The contact means according to claim 16, wherein the displacing means are adapted to displace the element surface part when the engaging force is exerted.

18. The contact means according to claim 16, wherein the displacing means is adapted to, via the resilient means, cause at least part of the engaging forces.

19. The contact means according to claim 15, wherein the displacing means are adapted to displace the element surface part subsequent to engagement of the engaging means of the first and second elements.

20. The contact means according to claim 14, wherein the engaging means of the first element are adapted to, when engaging with a corresponding engaging means of the other element, be displaced in a direction at an angle to that of the force exerted.

21. The contact means according to claim 20, wherein the engaging means of the first element is adapted to be displaced due to the engagement with the engaging means of the second element.

22. The contact means according to claim 20, wherein the engaging means of the first and second elements are adapted to, during the displacement, be in physical contact so as to perform a cleaning action of the physically contacting surface parts thereof.

23. The contact means according to claim 20, wherein the engaging means of the first element is adapted to be displaced during engaging and before the full engaging force is exerted.

24. The contact means according to claim 20, wherein the resilient means are adapted to render the engaging means of the first element rotatable around a rotation axis.

25. The contact means according to claim 24, wherein the resilient means are adapted to render the engaging means of the first element rotatable around a rotation axis being at least substantially perpendicular to the surface part at which the engaging means are exposed.

26. The contact means according to claim 24, wherein the resilient means are adapted to render the engaging means of the first element rotatable around a rotation axis being at least substantially parallel to the surface part at which the engaging means are exposed.

27. The contact means according to claim 24, wherein the engaging means of the first and second elements have contacting surface parts adapted to provide the rotation of the engaging means of the first element when the first and second elements engage.

28. The contact means according to claim 14, wherein the resilient means of the first element is adapted to ensure that the forces exerted by the engaging means have a predetermined relationship when the first and second elements engage.

29. The contact means according to claim 28, wherein the predetermined relationship is the forces being at least substantially the same.

30. The contact means according to claim 14, wherein the resilient means of the first element is adapted to, when one or more of the engaging means of the second element is displaced in a predetermined direction in relation to its or their intended position(s), displace the engaging means of the first element accordingly.

31. The contact means according to claim 14, wherein the first element and the second element are adapted to releasably engage by at least one of a screwing action, a fast lock action, a clicking action, friction, magnetic or electric forces, or gravity.

32. The contact means according to claim 14, wherein the first and second elements are interconnected in a manner so that they may be rotated in relation to each other around an axis of rotation, and wherein one of the first and second contact elements is/are shaped as at least a part of a circle, the circle having a center at least substantially coincident with the rotation axis.

33. The contact means according to claim 32, wherein the second contact element(s) is/are shaped as the at least part of a circle.

34. The contact means according to claim 32, wherein the first and second elements are interconnected in an at least substantially permanent manner.

* * * * *